(12) United States Patent
Cetrulo et al.

(10) Patent No.: US 7,239,184 B2
(45) Date of Patent: Jul. 3, 2007

(54) LOW POWER AND HIGH EFFICIENCY VOLTAGE-TO-CURRENT CONVERTER WITH IMPROVED POWER SUPPLY REJECTION

(75) Inventors: Raffaele Cetrulo, Austin, TX (US); Mark Whittington, Austin, TX (US)

(73) Assignee: National Instruments Corporation, Austin, TX (US)

( * ) Notice: Subject to any disclaimer, the term of this patent is extended or adjusted under 35 U.S.C. 154(b) by 78 days.

(21) Appl. No.: 11/116,026

(22) Filed: Apr. 27, 2005

(65) Prior Publication Data

US 2006/0244494 A1    Nov. 2, 2006

(51) Int. Cl.
    *H02M 11/00*    (2006.01)
(52) U.S. Cl. .................. 327/103; 327/320
(58) Field of Classification Search .......... 327/103, 327/320, 324
    See application file for complete search history.

(56) References Cited

U.S. PATENT DOCUMENTS

| | | | |
|---|---|---|---|
| 4,216,435 A | 8/1980 | Ahmed | 330/254 |
| 4,274,016 A * | 6/1981 | Ghahramani | 327/103 |
| 4,290,024 A | 9/1981 | Yokoyama | 330/85 |
| 4,460,837 A * | 7/1984 | Anderson, Jr. | 327/68 |
| 4,675,594 A | 6/1987 | Reinke | 323/317 |
| 4,961,046 A | 10/1990 | DeJager | 323/315 |
| 5,552,729 A | 9/1996 | Deguchi | 327/103 |
| 5,552,730 A | 9/1996 | Deguchi | 327/103 |
| 5,598,117 A | 1/1997 | Deguchi | 327/103 |
| 5,610,505 A | 3/1997 | Bernardson et al. | 323/312 |
| 5,619,125 A | 4/1997 | Lakshmikumar | 323/315 |
| 5,917,368 A | 6/1999 | Tan et al. | 327/543 |
| 6,219,261 B1 | 4/2001 | Stochino | 363/73 |

OTHER PUBLICATIONS

Thomas M. Frederiksen, "Intuitive Operational Amplfiers: From Basics to Useful Applications", McGraw-Hill, New York, NY 1988, 214-215.

* cited by examiner

*Primary Examiner*—Kenneth B. Wells
(74) *Attorney, Agent, or Firm*—Meyertons Hood Kivlin Kowert & Goetzel, P.C.; Jeffrey C. Hood; Mario J. Lewin (57) ABSTRACT

A low power and high efficiency voltage-to-current (V/I) converter designed with few parts and having improved power supply rejection. The V/I converter may include an op-amp, a MOSFET, and a first and second voltage dividers. The first voltage divider circuit may include a first, second, third, and fourth resistors. A source terminal of the MOSFET may be connected to a junction of the third and fourth resistors and the fourth resistor may be connected to a positive supply rail. Also, an inverting input terminal of the op-amp may be coupled to a junction of the second and third resistors. Additionally, the second resistor may be coupled to the first resistor, which may be connected to an input terminal of the V/I converter. The V/I converter typically has very good DC rejection of the power supply because the first and second voltage dividers are designed to have the same ratios.

26 Claims, 5 Drawing Sheets

LOW POWER AND HIGH EFFICIENCY VOLTAGE-TO-CURRENT CONVERTER WITH IMPROVED POWER SUPPLY REJECTION

BACKGROUND OF THE INVENTION

1. Field of the Invention

The present invention relates generally to measurement and instrumentation systems and, more specifically, to voltage-to-current converter design.

2. Description of the Related Art

Scientists and engineers often use measurement systems to perform a variety of functions, including measurement of a physical phenomena or unit under test (UUT), test and analysis of physical phenomena, process monitoring and control, control of mechanical or electrical machinery, data logging, laboratory research, and analytical chemistry, to name a few examples.

A typical measurement system comprises a computer system with a measurement device or measurement hardware. The measurement device may be a computer-based instrument, a data acquisition device or board, a programmable logic device (PLD), an actuator, or other type of device for acquiring or generating data. The measurement device may be a board or module plugged into one of the I/O slots of the computer system, or a board or module plugged into a chassis, or an external device. Generally, the computer system has an I/O bus and connectors or slots for receiving I/O boards. Various computer systems and I/O buses may be used to implement a processing system for receiving the measurements. The computer may receive measurements from multiple sources, where, for example, different sources may interface with the computer through respective input and output measurement modules.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a UUT.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor.

In a measurement or data acquisition process, analog signals may be received by a digitizer, which may reside in an analog input module of a DAQ system. The analog signals may be received from a sensor, converted to digital data (possibly after being conditioned) by an analog-to-digital converter (ADC), and transmitted to a computer system for storage and/or analysis. In addition, the computer system may generate digital signals that are provided to one or more digital to analog converters (DACs) in an analog output module of the DAQ system. The DACs convert the digital signal to an analog output signal that is used, e.g., to stimulate a UUT.

SUMMARY OF THE INVENTION

Various embodiments of a voltage-to-current (V/I) converter are disclosed. The V/I converter may be a low power and high efficiency circuit designed using very few parts, e.g., one op-amp and one transistor. In one embodiment, the V/I converter may include an op-amp, a metal-oxide semiconductor field-effect transistor (MOSFET), a positive supply rail, an input terminal, and output terminal, a first voltage divider, and a second voltage divider.

In one embodiment, the op-amp includes an inverting input terminal, a non-inverting input terminal, and an output terminal. The MOSFET includes a gate terminal, a source terminal, and a drain terminal. The gate terminal of the MOSFET may be coupled to the output terminal of the op-amp and the drain terminal of the MOSFET may be connected to the output terminal of the V/I converter. The first voltage divider circuit may include a first resistor, a second resistor, a third resistor, and a fourth resistor. The source terminal of the MOSFET may be connected to a junction of the third and fourth resistors and the fourth resistor may be connected to the positive supply rail. The inverting input terminal of the op-amp may be coupled to a junction of the second and third resistors. Also, the second resistor may be coupled to the first resistor and the first resistor may be connected to the input terminal of the V/I converter. The second voltage divider circuit may include a fifth resistor and a sixth resistor. The non-inverting input terminal of the op-amp may be coupled to a junction of the fifth and sixth resistors. Also, the fifth resistor may be coupled to the positive supply rail and the sixth resistor may be connected to ground.

The V/I converter may be based on a differential amplifier that reflects a control voltage on a sense resistor, which creates a current across the sense resistor. The current is then passed through a MOSFET to the output terminal of the V/I converter, therefore most of the power dissipation occurs on the MOSFET.

The V/I converter typically has very good DC rejection of the power supply because the resistive networks (e.g., the first and second voltage dividers) are designed to have the same ratios. For example, a ratio corresponding to the second voltage divider circuit, which is equivalent to a resistance value of the fifth resistor divided by a resistance value of the sixth resistor, is equal to a ratio corresponding to the first voltage divider circuit, which is equivalent to a resistance value of the third resistor plus a resistance value of the fourth resistor divided by a resistance value of the first resistor plus a resistance value of the second resistor. When the fourth resistor was added to the design to serve as the sense resistor, the first resistor was also added to match the ratios of the two voltage dividers, so that the output current of the V/I converter may be independent of the variations on the positive voltage rail $V_S$. The output current may be dependent on the control voltage and the gain of the circuit.

In one embodiment, the second voltage divider, which includes the fifth and sixth resistors, may divide the voltage corresponding to the positive supply rail $V_S$ by a fixed amount. Therefore, the common mode voltage of the op-amp may be constant, which may reduce non-linearity errors (e.g., due to changing bias currents) in the circuit. Additionally, in some embodiments, the output terminal of the V/I converter may be connected to a protection circuit to prevent over-voltage and over-current conditions.

BRIEF DESCRIPTION OF THE DRAWINGS

A better understanding of the present invention may be obtained when the following detailed description is considered in conjunction with the following drawings, in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION OF THE INVENTION

U.S. patent application Ser. No. 10/195,051 and Publication No. 2003/0074489 titled "Measurement System with Modular Measurement Modules That Convey Interface Information" filed on Jul. 12, 2002 whose inventors are Perry Steger, Garritt W. Foote, David Potter, and James J. Truchard is hereby incorporated by reference in its entirety as though fully and completely set forth herein.

Measurement System

Figure 1:
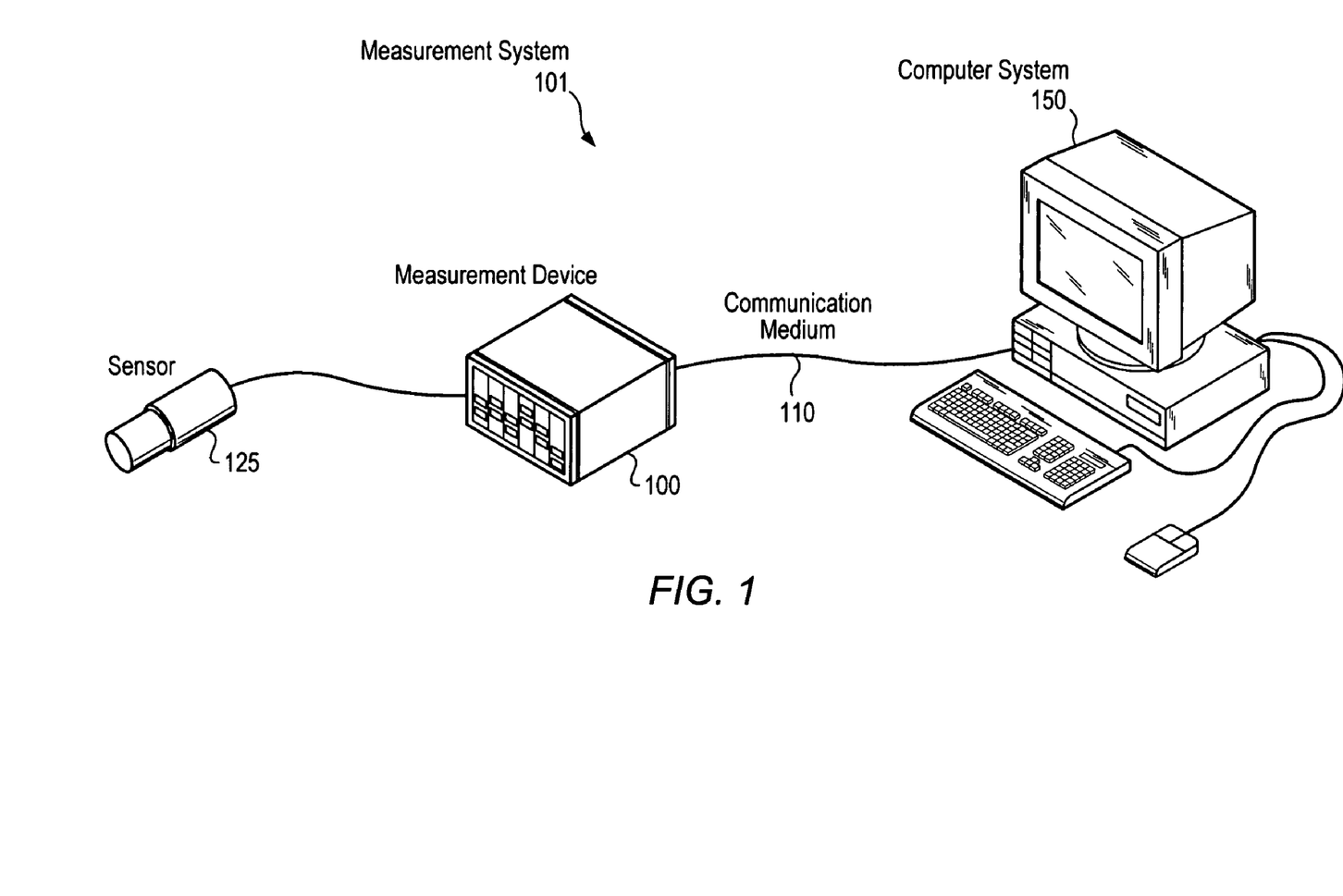
FIG. 1 is a diagram of one embodiment of a computer-based measurement or data acquisition system.

FIG. 1 is a diagram of one embodiment of a computer-based measurement or data acquisition system 101. The measurement system 101 may include a computer system 150 (e.g., a host computer) coupled to a measurement device or data acquisition device 100. In one embodiment, the measurement device 100 may include a carrier and one or more measurement modules. As used herein, the term "measurement device" is intended to include any of various types of devices that are operable to acquire, generate, and/or store data, which may optionally be further operable to analyze or process the acquired or stored data. Examples of a measurement device include various types of instruments, such as oscilloscopes, multimeters, data acquisition devices or cards, devices external to a computer that operate similarly to a data acquisition cards, smart sensors, one or more DAQ or input measurement modules in a chassis, and other similar types of devices.

The measurement device 100 may in turn couple to or comprise a sensor or actuator 125, such as a pressure or temperature sensor, a thermocouple, an imaging device, (e.g. a camera), or any other type of sensor or actuator. In one example, the sensor 125 may be a temperature sensor, which is comprised in a unit under test (UUT). In this example, the measurement device 100 may receive a temperature reading from the temperature sensor and convert the analog data to digital form to be sent to the computer system 150 for analysis. In another example, the computer system 150 may send data to the measurement device 100 for various purposes, such as for use in generating analog signals used for stimulating the sensor 125 and/or the UUT.

The computer system 150 may couple to the measurement device 100 through a serial bus, such as a USB (Universal Serial Bus), or any other communication medium 110 including Ethernet, wireless media such as IEEE 802.11 (Wireless Ethernet), a network such as a Control Area Network (CAN) or the Internet, serial or parallel buses, or any other transmission means. The computer system 150 may comprise a CPU, a display screen, memory, and one or more input devices such as a mouse or keyboard. The computer system 150 may operate with the measurement device 100 to analyze or measure data from the sensor 125 and/or measurement device 100 or to control the sensor 125 and/or measurement device 100.

The computer system 150 may include a processor, which may be any of various types, including an x86 processor, e.g., a Pentium™ class, a PowerPC™ processor, a CPU from the SPARC™ family of RISC processors, as well as others. Also, the computer system 150 may also include one or more memory subsystems (e.g., Dynamic Random Access Memory (DRAM) devices). The memory subsystems may collectively form the main memory of computer system 150 from which programs primarily execute. The main memory may be operable to store a user application and a driver software program. The user application may be executable by the processor to conduct the data acquisition/generation process. The driver software program may be executable by the processor to receive data acquisition/generation tasks from the user application and program the measurement device 100 accordingly.

Measurement Device

Figure 2:
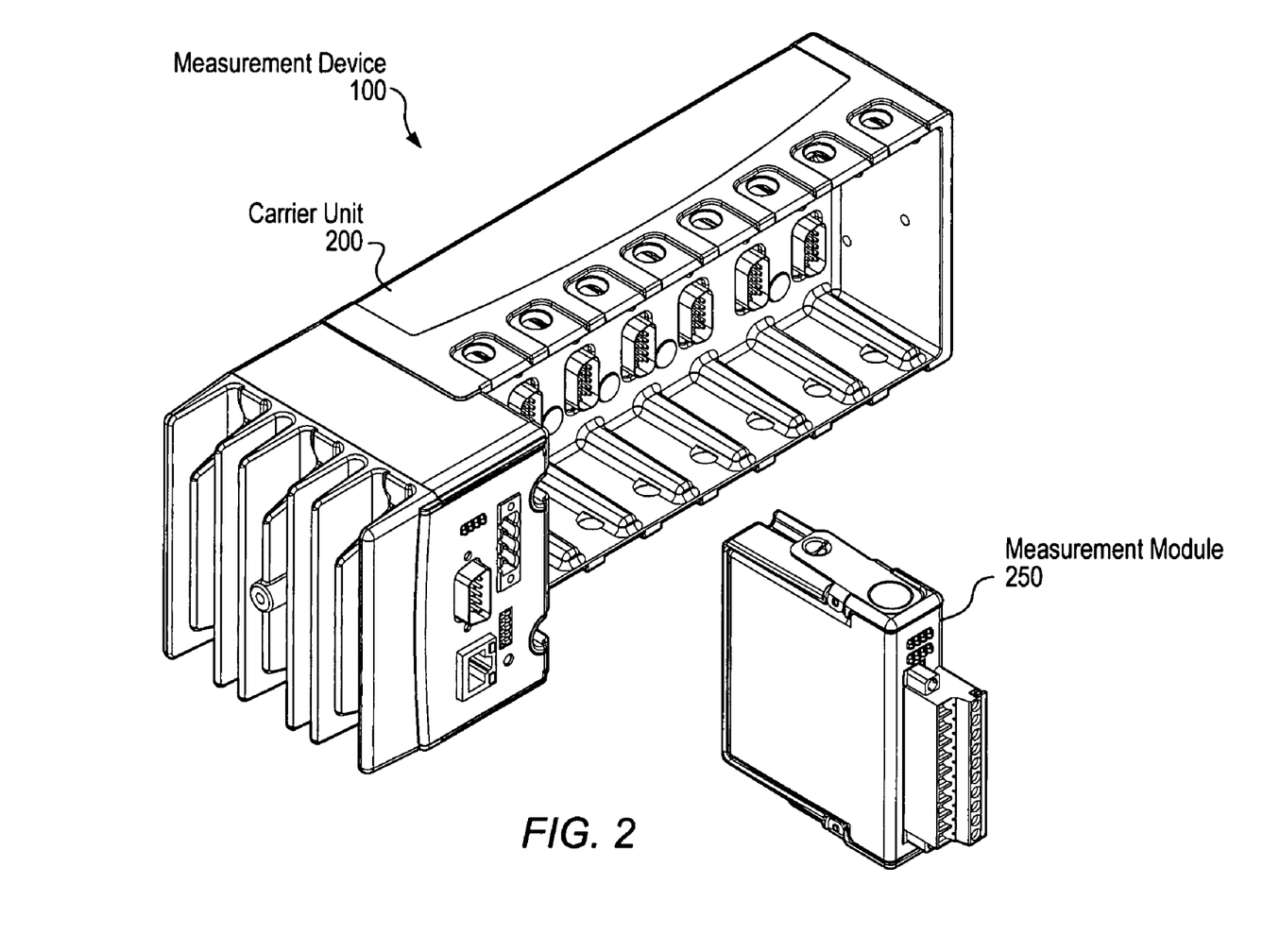
FIG. 2 is an isometric view of one embodiment of a measurement device including a carrier unit and one or more measurement modules.

FIG. 2 is an isometric view of one embodiment of a measurement device 100 including a carrier unit 200 and one or more measurement modules 250. As described above, the measurement device 100 may be included in the measurement and data acquisition system 101 of FIG. 1. The carrier unit 200 is operable to receive interface protocol information from the measurement module 250 specifying how to operate or interface with the measurement module 250. In one embodiment, the carrier unit 200 may then communicate the interface protocol information to the corresponding computer system, e.g., computer system 150 of FIG. 1. Alternatively, the measurement module 250 may communicate the interface protocol information directly to the computer system. Based on the interface protocol information, the computer system may program or configure the carrier unit 200 to implement the interface as specified by the measurement module 250. In other words, the measurement module 250 may tell the carrier 200 how to "talk" with it, and the carrier 200 may then tell the computer system how to program the carrier 200 to communicate with the measurement module 250 accordingly (or the measurement module 250 may tell the computer system directly how to program the carrier 200). The computer system may then program the carrier 200, thereby implementing the interface specified in the interface protocol information communicated by the measurement module 250. This process may be referred to as initialization of the measurement module/carrier. The configured carrier 200 and the measurement module 250 may then be operable to perform measurement and data acquisition operations using the sensor and/or the computer system.

In one embodiment, the measurement module 250 may be in the form of a measurement cartridge and the carrier 200 in the form of a cartridge carrier which is operable to receive one or more of the measurement cartridges. For example, the carrier unit 200 may comprise a chassis, a backplane comprised in the chassis providing for electrical communication, and one or more slots comprised in the chassis. Each of the one or more slots may include a connector that is coupled to the backplane, where each of the one or more slots may be adapted for receiving a measurement module 250. Thus, the carrier 200 may host a plurality of measurement cartridges, each of which may provide measurement and/or control functionality for a measurement or control operation or task. The carrier 200 may be operable to communicate with each measurement cartridge (i.e., module) and be programmed or configured (e.g., by the computer system or by a processor on the carrier 200) to implement the respective interface of each measurement cartridge. In this manner a suite of sensors may be fielded, each of which feeds signals to a respective measurement cartridge which in turn communicates through a respective interface (protocol) with the cartridge carrier. The cartridge carrier may in turn couple to a computer system. Thus, the carrier 200 may support a heterogeneous plurality of interfaces without having to include a heterogeneous set of interface hardware components.

The measurement modules 250 (or cartridges) may be easily removed, added, and replaced. In other words, measurement modules 250 may be exchanged to change the configuration or capabilities of the measurement system, e.g., measurement system 101. In one embodiment, the measurement module 250 may be replaced without powering down the measurement system, i.e., the measurement module 250 may be "hot-plugged" into the carrier 200, where the measurement module 250 may communicate the interface protocol information to the carrier 200 upon attachment, and the carrier 200 is programmed in response, as described above. In another embodiment, the measurement module 250 and/or carrier 200 may require a reboot or reset after attachment to perform the described initialization. Thus, the interface circuitry (i.e., the measurement module 250) may be operable to communicate the interface protocol to the carrier unit 200 upon one or more of attachment of the measurement module 250 to the carrier unit 200, reset of the measurement module 250, reset of the carrier unit 200, reboot of the measurement module 250, and reboot of the carrier unit 200.

In one embodiment, the carrier unit 200 may be a reconfigurable I/O (RIO) carrier which may be configured to receive one or more RIO measurement modules (e.g., module 250). As used herein, the term "RIO" carrier refers to a carrier which includes reconfigurable hardware which is configurable with respective interface protocols for one or more measurement modules. In other words, a RIO carrier with multiple module slots may be configured with multiple interfaces for inserted measurement modules, such that each module's interface is implemented by the RIO carrier. For example, if three RIO modules with three different respective interfaces are inserted in three slots of the RIO carrier, then the RIO carrier may be configured to implement the three interfaces. Similarly, if multiple modules are sequentially inserted into and removed from a particular slot, the RIO carrier may be configured respectively for each module, i.e., sequentially. The RIO carrier may further be operable to couple to any of various products or platforms.

Measurement Module

Figure 3:
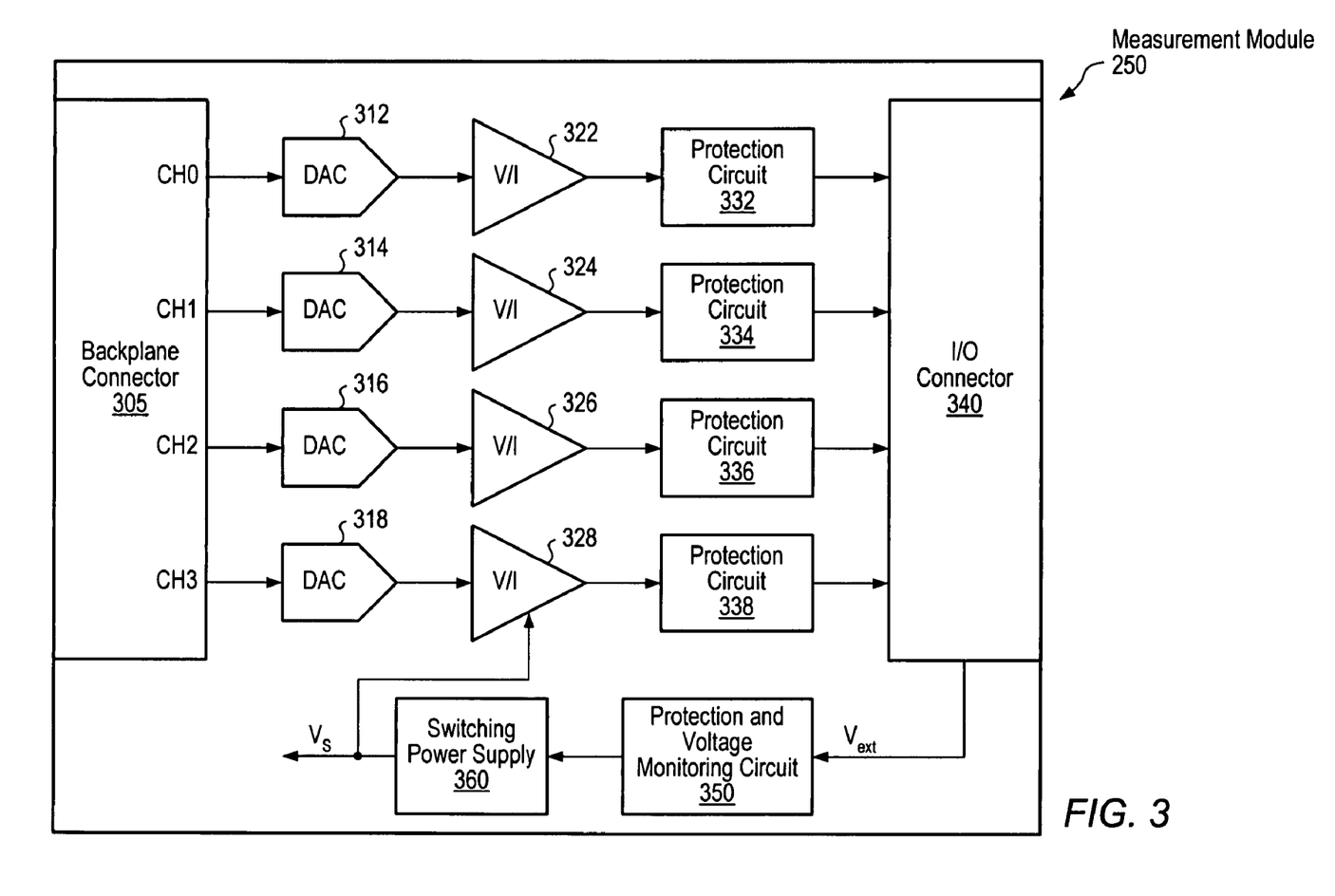
FIG. 3 is a block diagram of one embodiment of a measurement module including one or more voltage-to-current converters.

FIG. 3 is a block diagram of one embodiment of a measurement module 250 including one or more voltage-to-current (V/I) converters. As described above, the measurement module 250 may be removably received in a carrier, e.g., carrier 200 of FIG. 2, and the measurement module 250 may be a RIO measurement module. Components that correspond to those shown in FIG. 1 and FIG. 2 are numbered identically for simplicity and clarity.

In one embodiment, the measurement module 250 may be four channel (e.g., CH0-CH4) analog output module including a backplane connector 305, a plurality of digital-to-analog converters (DACS) 312, 314, 316, and 318, a plurality of voltage-to-current (V/I) converters 322, 324, 326, and 328, a plurality of protection circuits 332, 334, 336, and 338, an input/output (I/O) connector, a protection and voltage monitoring circuit 350, and a switching power supply 360. The backplane connector 305 may be coupled to the DACs 312, 314, 316, and 318, which may be connected to the V/I converters 322, 324, 326, and 328. The protection circuits 332, 334, 336, and 338 may be connected between the V/I converters and the I/O connector 340. Also, the protection and voltage monitoring circuit 350 may be connected between the I/O connecter 340 and the switching power supply 360.

The backplane connector 305 may connect, e.g., to the backplane of the carrier unit 200 shown in FIG. 2. The backplane connector 305 may receive digital signals from the computer system (e.g., computer system 150 of FIG. 1) via the carrier unit 200 to be provided to the DACs (e.g., DAC 312). The DACs may convert the received digital signals to analog form. In one embodiment, the digital signals may need to be converted to analog form to stimulate the unit under test (UUT), which may be connected to the I/O connector 340.

The V/I converters (e.g., V/I converter 322) may receive a control voltage from the DACs and may generate an output current corresponding to the control voltage. Each of the V/I converters typically has very good DC rejection of the power supply (e.g., the switching power supply 360) because resistive networks (e.g., a first and second voltage dividers) included in each of the V/I converters are designed to have the same ratios, as will be further described below with reference to FIGS. 4 and 5. If the ratio corresponding to the first voltage divider is equal to the ratio corresponding to the second voltage divider, the output current of the V/I converter may be independent of the positive voltage rail ($V_S$) corresponding to the switching power supply 360 and may be dependent of the control voltage received from the corresponding DAC.

The protection circuits (e.g., protection circuit 332) may prevent over-voltage and over-current conditions in the measurement module 250, especially in the V/I converters (e.g., V/I converter 322). Therefore, the protection circuits may prevent damage to components of the measurement module 250.

The switching power supply 360 may be a high efficiency DC/DC converter, which may receive an external voltage $V_{EXT}$. The switching power supply 360 may reduce the internal power dissipation inside the measurement module 250 to the minimum amount possible based on the design and system requirements even if the measurement module 250 receives relatively high voltages from external voltage supplies. In one embodiment, the switching power supply 360 may comprise an internal SEPIC converter (Flyback-like topology) which converts an external voltage ($V_{EXT}$) of between 9 and 36 VDC to 13.5 VDC (e.g., the positive supply rail $V_S$). It is noted however that in other embodiments the switching power supply 360 may be able to receive a wider range of voltages. It is also noted that in other embodiments the switching power supply 360 may convert the external voltage $V_{EXT}$ to other voltages depending on the system requirements.

The protection and voltage monitoring circuit 350 may be designed to function like a switch and protect the switching power supply 360 from an external voltage ($V_{EXT}$) that is outside the allowable range of voltages. In one example, as described above, the switching power supply 360 may be configured to receive an external voltage that is within the range of between 9 and 36 VDC. In one embodiment, the protection and voltage monitoring circuit 350 may include a MOSFET circuit, which may provide the functionality of a diode without the large voltage drop. Also, the protection and voltage monitoring circuit 350 may include a current source, which may limit a gate-to-source voltage of the MOSFETs to a given voltage value that is below a maximum allowed voltage value to prevent damage to the MOSFETs.

It should be noted that the components described with reference to FIG. 3 are meant to be exemplary only, and are not intended to limit the invention to any specific set of components or configurations. For example, in various embodiments, one or more of the components described may be omitted, combined, modified, or additional components included, as desired. For instance, in one embodiment, the measurement module 250 may include any number of channels, e.g., two or eight channels. Also, in one embodiment, the design of the switching power supply 360 and/or the protection circuits may vary.

Voltage-to-Current Converter

Figure 4:
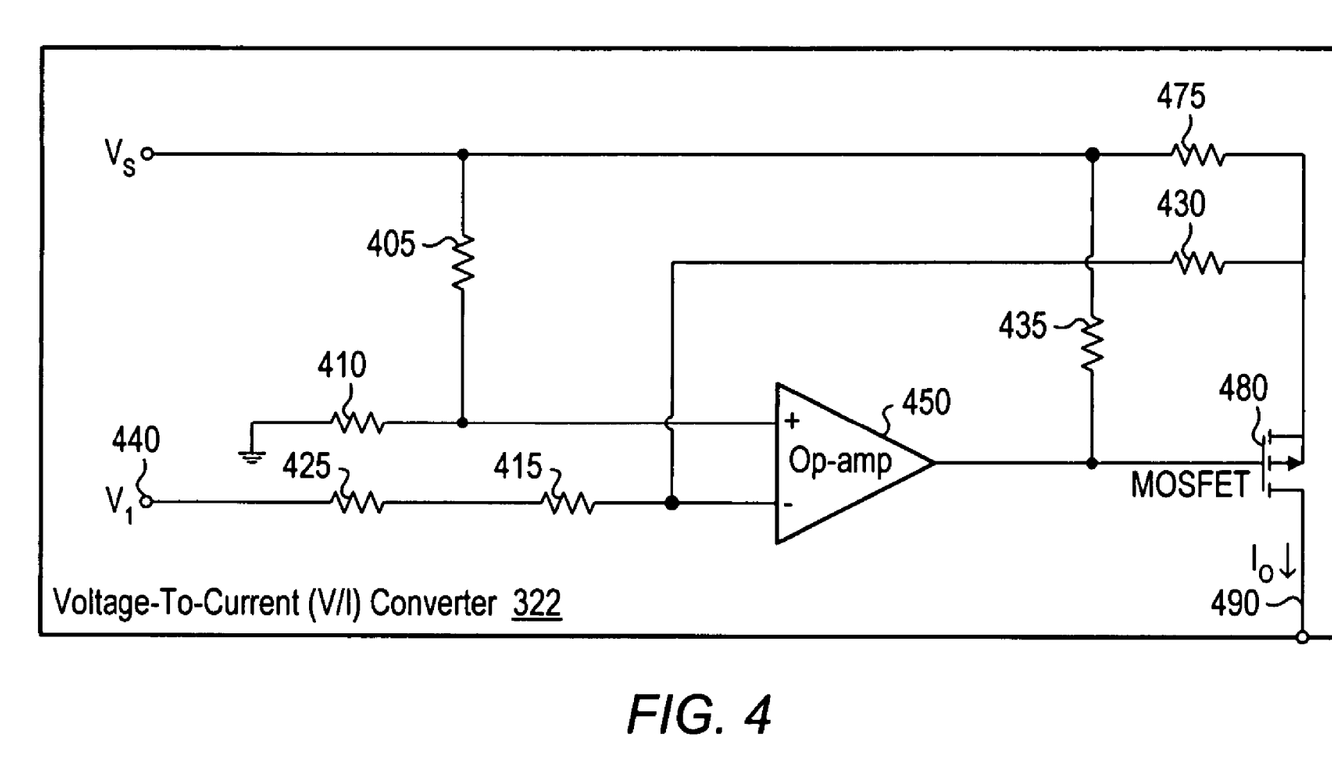
FIG. 4 is a block diagram of one embodiment of a voltage-to-current (V/I) converter.

FIG. 4 is a block diagram of one embodiment of a voltage-to-current (V/I) converter 322. Components that correspond to those shown in FIGS. 1-3 are numbered identically for simplicity and clarity. The V/I converter 322 may be an integrated circuit (IC), for example, an analog IC, which may be included in a measurement module, e.g., the measurement module 250 of FIG. 3. It is noted however that in other embodiments the V/I converter 322 may be included in other devices. The V/I converter 322 may be a low power and high efficiency circuit having improved power supply rejection.

The V/I converter 322 may include an op-amp 450, a metal-oxide semiconductor field-effect transistor (MOSFET) 480, and resistors 405, 410, 415, 475, 425, 430, and 435. In one embodiment, resistors 415, 425, 430, and 475 may function as a first voltage divider of the V/I converter 322, and resistors 405 and 410 may function as a second voltage divider of the V/I converter 322. The V/I converter 322 may also include a positive supply rail ($V_S$), which is connected to an external power supply, e.g., the switching power supply 360 of the measurement module 250 of FIG. 3 or an external power supply in the carrier unit 200 of FIG. 2. In addition, the V/I converter 322 may include an input terminal 440 that receives a control voltage ($V_1$) and an output terminal 490 that provides an output current ($I_O$) generated by the V/I converter 322 and corresponding to the control voltage $V_1$. The op-amp 450 includes an inverting input terminal, a non-inverting input terminal, and an output terminal. The MOSFET 480 includes a gate terminal, a source terminal, and a drain terminal.

The gate terminal of the MOSFET 480 may be coupled to the output terminal of the op-amp 450, and the drain terminal of the MOSFET 480 may be connected to the output terminal 490 of the V/I converter 322. The resistor 435 may be connected between the positive supply rail and the gate terminal of the MOSFET 480. The first voltage divider may be connected to the inverting input terminal of the op-amp 450, the input terminal 440 of the V/I converter 322, the positive supply rail, and the source terminal of the MOSFET 480. More specifically, the source terminal of the MOSFET 480 may be coupled to a junction of the resistors 430 and 475, and the resistor 475 may be coupled to the positive supply rail. The inverting input terminal of the op-amp 450 may be coupled to a junction of the resistors 415 and 430. The resistor 415 may be coupled to the resistor 425 and the resistor 425 may be coupled to the input terminal 440 of the V/I converter 322. The second voltage divider circuit may be connected to the positive supply rail and the non-inverting input terminal of the op-amp 450. More specifically, the non-inverting input terminal of the op-amp 450 may be coupled to a junction of the resistors 405 and 410. The resistor 405 may be coupled to the positive supply rail, and the resistor 410 may be coupled to ground.

It should be noted that the components described with reference to FIG. 4 are meant to be exemplary only, and are not intended to limit the invention to any specific set of components or configurations. For example, in various embodiments, one or more of the components described may be omitted, combined, modified, or additional components included, as desired. For instance, in one embodiment the MOSFET 480 may be replaced by other types of isolated-gate FETs (IGFETs) or by other types of transistors such as FETs or BJTs. Also, in some embodiments the number of resistors may vary, e.g., the resistor 405 may represent the combination of two resistors in series.

As illustrated in FIG. 4, the V/I converter 322 is a low power and high efficiency circuit designed using very few parts, e.g., one op-amp and one transistor. The V/I converter 322 may be based on a differential amplifier that reflects the control voltage $V_1$ on a sense resistor, i.e., resistor 475, which creates a current across the sense resistor. The current is then passed through the MOSFET 480 to the output terminal 490, therefore most of the power dissipation occurs on the MOSFET 480. As will be described further below, the output current ($I_O$) may be dependent on the control voltage $V_1$ and the gain of the circuit, and the output current $I_O$ may independent of the positive voltage rail $V_S$.

The V/I converter 322 typically has very good DC rejection of the power supply (e.g., the switching power supply 360 corresponding to the positive voltage rail $V_S$) because the resistive networks (e.g., the first and second voltage dividers) are designed to have the same ratios. For example, a ratio corresponding to the second voltage divider circuit, which is equivalent to a resistance value of the resistor 405 divided by a resistance value of the resistor 410, is equal to a ratio corresponding to the first voltage divider circuit, which is equivalent to a resistance value of the resistor 430 plus a resistance value of the resistor 475 divided by a resistance value of the resistor 425 plus a resistance value of the resistor 415. When the resistor 475 was added to the design to serve as the sense resistor, the resistor 425 was also added to match the ratios of the two voltage dividers, so that the output current $I_O$ may be independent of the variations on the positive voltage rail $V_S$. The fact that the output current $I_O$ is independent of the positive voltage rail $V_S$ and dependent of the control voltage $V_1$ may be seen from the transfer function (shown below) of the V/I converter 322. In the transfer function, the first resistor is R1, the second resistor is R2, the third resistor is R3, the fourth resistor is R4, the fifth resistor is R5, and the sixth resistor is R6.

$$I_O(V_1, V_S) \approx \frac{R3}{R2+R1} * \frac{V1}{R4} + \frac{V1}{R2+R1} + V_S * \left[ \frac{1}{R4} \left[ 1 - \left( 1 + \frac{R3}{R2+R1} + \frac{R4}{R2+R1} \right) * \frac{R6}{R6+R5} \right] \right]$$

If the ratio corresponding to the first voltage divider is equal to the ratio corresponding to the second voltage divider, the term that multiplies with the positive voltage rail $V_S$ is equal to zero and therefore the output current $I_O$ may be independent of the positive voltage rail $V_S$ (i.e., the switching power supply 360) and dependent of the control voltage $V_1$. For example, if R1=100Ω, R2=50 kΩ, R3=10 kΩ, R4=20Ω, R5=10 kΩ, and R6=50 kΩ, the ratio associated with the first voltage divider (R3+R4/R1+R2=1/5) is equal to the ratio associated with the second voltage divider (R5/R6=1/5). If the values are plugged into the term that multiplies the positive supply rail Vs, the transfer function simplifies to:

$$I_O(V_1) \approx \frac{R3}{R2+R1} * \frac{V1}{R4} + \frac{V1}{R2+R1}$$

In one embodiment, the ratio corresponding to the resistance value of the resistor 475 divided by the resistance value of the resistor 425 is equal to a ratio corresponding to the resistance value of the resistor 430 divided by the resistance value of the resistor 415, which may also be equal to the ratio corresponding to the resistance value of the resistor 405 divided by the resistance value of the resistor 410. In another embodiment, the resistance values of the resistors 405, 410, 415, and 435 are the same, and the resistance values of the resistors 425 and 475 are the same. It is noted that the resistance values of the resistors may be any value as long as the ratio of the first voltage divider is equal to the ratio of the second voltage divider.

In one embodiment, the second voltage divider, which includes the resistors 405 and 410, may divide the voltage corresponding to the positive supply rail $V_S$ by a fixed amount. Therefore, the common mode voltage of the op-amp 450 may be constant, which may reduce non-linearity errors (e.g., due to changing bias currents) in the circuit. It is noted that the fixed amount by which the positive supply rail $V_S$ is divided is dependent upon the values of the resistors 405 and 410.

The V/I converter 322 is a low power circuit that is highly efficient in terms of the power required to operate versus the output power. For example, the V/I converter 322 may only need 1.4 mA current to bias the circuit and the output current may be 20 mA. It is noted however that the power required to operate the circuit and the output power may vary depending at least on the components used in the design of the V/I converter 322 and the requirements of the system.

Voltage-to-Current Converter and Protection Circuitry

Figure 5:
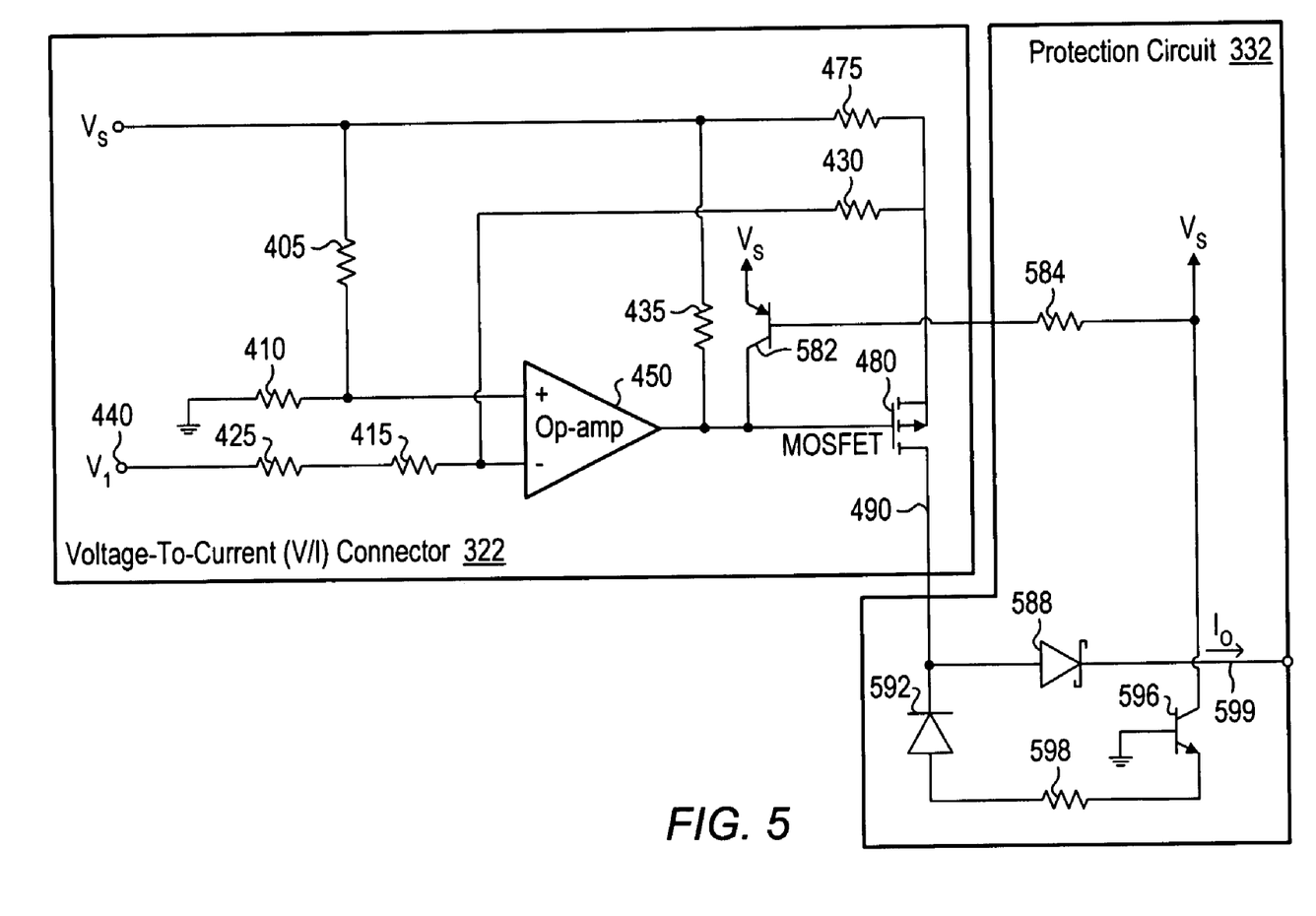
FIG. 5 is a block diagram of one embodiment of a measurement module including a voltage-to-current (V/I) converter and a protection circuit.

FIG. 5 is a block diagram of one embodiment of a measurement module including the voltage-to-current (V/I) converter 322 and a protection circuit 332. Components that correspond to those shown in FIGS. 1-4 are numbered identically for simplicity and clarity. The protection circuit 332 may be connected to the output terminal 490 of the V/I converter to prevent over-voltage and over-current conditions. The protection circuit 332 may be included within the IC of the V/I converter 322. It is noted however that in other embodiments the protection circuit 332 may be an integrated circuit (IC), for example, an analog IC, which may be included in a measurement module, e.g., the measurement module 250 of FIG. 3.

In one embodiment, the protection circuit 332 may include a Schottky diode 588, a pn-junction diode 592, a bipolar junction transistor (BJT) 596, a BJT 582, and resistors 584 and 598. The Schottky diode 588 may be connected between the drain terminal of the MOSFET 480 and an output terminal 599 of the protection circuit 332. The pn-junction diode 592 may be connected to a junction of the drain terminal of the MOSFET 480 and the Schottky diode 588. The pn-junction diode 592 may also be connected to an eighth resistor. In addition, the BJTs 596 and 582 may each include a base terminal, an emitter terminal, and a collector terminal. The emitter terminal of the BJT 596 may be coupled to the resistor 598, the base terminal of the BJT 596 is connected to ground, and the collector terminal of the BJT 596 is coupled to a junction of the positive supply rail $V_S$ and the resistor 584. The base terminal of the BJT 582 may be coupled to the resistor 584, the emitter terminal of the BJT 582 may be coupled to the positive supply rail $V_S$, and the collector terminal of the BJT 582 may be connected to the gate terminal of the MOSFET 480.

It should be noted that the components described with reference to FIG. 5 are meant to be exemplary only, and are not intended to limit the invention to any specific set of components or configurations. For example, in various embodiments, one or more of the components described may be omitted, combined, modified, or additional components included, as desired. For instance, in one embodiment the BJTs 596 and/or 582 may be replaced by other types of transistors, and the diodes 588 and/or 592 may be replaced by other types of diodes. Also, in some embodiments the number of resistors may vary, e.g., the resistor 598 may represent the combination of two resistors in series, and/or a resistor may be added between the output terminal of the op-amp 450 and the gate terminal of the MOSFET 480.

The protection circuit 332 may protect the V/I converter 322 if the output is shorted to a negative or a positive voltage. For example, if the output terminal 599 of the protection circuit 332 is connected to a negative voltage, since the base terminal of the BJT 596 is connected to ground, the pn-junction diode 592 will turn on and current will flow through the BJT 596. Also, current will be pulled from the BJT 582, which is connected between the positive supply rail $V_S$ and the gate terminal of the MOSFET 480. This may saturate the BJT 582 (e.g., to the positive voltage rail), which may turn off the MOSFET 480. Therefore, when the feedback loop is opened the op-amp 450 is prevented from driving the output. This may prevent damage to the MOSFET 480 and other components from over-voltage and over-current conditions.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A voltage-to-current (V/I) converter comprising:
a positive supply rail;
an input terminal operable to receive a control voltage;
an output terminal operable to provide an output current corresponding to the control voltage;
an op-amp including an inverting input terminal, a non-inverting input terminal, and an output terminal;
a transistor including a gate terminal, a source terminal, and a drain terminal, wherein the gate terminal is coupled to the output terminal of the op-amp;
a first voltage divider circuit including a first resistor, a second resistor, a third resistor, and a fourth resistor, wherein the source terminal of the transistor is coupled to a junction of the third and fourth resistors, wherein the fourth resistor is also coupled to the positive supply rail, wherein the inverting input terminal of the op-amp is coupled to a junction of the second and third resistors, and wherein the second resistor is coupled to the first resistor and the first resistor is coupled to the input terminal of the V/I converter; and
a protection circuit coupled to the transistor to prevent over-voltage and over-current conditions, the protection circuit including:
a first diode coupled between the drain terminal of the transistor and the output terminal of the V/I converter;
a second diode coupled to a junction of the drain terminal of the transistor and the first diode, wherein the second diode is also coupled to a fifth resistor;
a first bipolar junction transistor (BJT) including a base terminal, an emitter terminal, and a collector terminal, wherein the emitter terminal of the first BJT is coupled to the fifth resistor and the base terminal of the first BJT is coupled to ground, wherein the collector terminal of the first BJT is coupled to a junction of the positive supply rail and a sixth resistor; and
a second BJT including a base terminal, an emitter terminal, and a collector terminal, wherein the base terminal of the second BJT is coupled to the sixth resistor and the emitter terminal of the second BJT is coupled to the positive supply rail, wherein the collector terminal of the second BJT is coupled to the gate terminal of the transistor.

2. The V/I converter of claim 1, wherein the transistor is a metal-oxide semiconductor field-effect transistor (MOSFET).

3. The V/I converter of claim 1, further comprising a second voltage divider circuit coupled to the positive supply rail and the non-inverting input terminal of the op-amp, wherein the second voltage divider circuit includes a seventh resistor and an eighth resistor, wherein the non-inverting input terminal of the op-amp is coupled to a junction of the seventh and eighth resistors, and wherein the seventh resistor is also coupled to the positive supply rail and the eighth resistor is also coupled to ground.

4. The V/I converter of claim 3, wherein a ratio corresponding to the second voltage divider circuit, which is equal to a resistance value of the seventh resistor divided by a resistance value of the eighth resistor, is equal to a ratio corresponding to the first voltage divider circuit, which is equal to a resistance value of the third resistor plus a resistance value of the fourth resistor divided by a resistance value of the first resistor plus a resistance value of the second resistor.

5. The V/I converter of claim 4, wherein the ratio corresponding to the second voltage divider circuit is equal to the ratio corresponding to the first voltage divider circuit to improve power supply rejection.

6. The V/I converter of claim 4, wherein if the first resistor is R1, the second resistor is R2, the third resistor is R3, the fourth resistor is R4, the seventh resistor is R7, the eighth resistor is R8, the control voltage is $V_1$, the positive supply rail is $V_S$, and the output current is $I_O$, a transfer function of the V/I converter is the following:

$$I_O(V_1, V_S) \approx \frac{R3}{R2+R1} * \frac{V1}{R4} + \frac{V1}{R2+R1} + V_S * \left[ \frac{1}{R4}\left[1 - \left(1 + \frac{R3}{R2+R1} + \frac{R4}{R2+R1}\right) * \frac{R6}{R6+R5}\right]\right]$$

7. The V/I converter of claim 6, wherein if the ratio corresponding to the second voltage divider circuit is equal to the ratio corresponding to the first voltage divider circuit, the output current ($I_O$) is independent of the positive supply rail ($V_S$) and the transfer function of the V/I converter simplifies to the following:

$$I_O(V_1) \approx \frac{R3}{R2+R1} * \frac{V1}{R4} + \frac{V1}{R2+R1}$$

8. The V/I converter of claim 7, wherein a ratio corresponding to the resistance value of the fourth resistor divided by the resistance value of the first resistor is equal to a ratio corresponding to the resistance value of the third resistor divided by the resistance value of the second resistor, which is also equal to the ratio corresponding to the resistance value of the seventh resistor divided by the resistance value of the eighth resistor.

9. The V/I converter of claim 3, further comprising a ninth resistor coupled between the positive supply rail and the gate terminal of the transistor.

10. The V/I converter of claim 1, wherein a common mode voltage of the op-amp is constant which reduces non-linearity errors.

11. The V/I converter of claim 1, wherein the fourth resistor is a sense resistor, and the V/I converter is operable to reflect the control voltage across the sense resistor to generate a current to be provided to the transistor.

12. A measurement device comprising:
one or more digital-to-analog converters (DACs) operable to convert received digital data into analog data;
a voltage-to-current (V/I) converter coupled to the one or more DACs, the V/I converter comprising:
a positive supply rail;
an input terminal operable to receive a control voltage;
an output terminal operable to provide an output current corresponding to the control voltage;
an op-amp including an inverting input terminal, a non-inverting input terminal, and an output terminal;
a transistor including a gate terminal, a source terminal, and a drain terminal, wherein the gate terminal is coupled to the output terminal of the op-amp and the drain terminal is coupled to the output terminal of the V/I converter; and
a first voltage divider circuit including a first resistor, a second resistor, a third resistor, and a fourth resistor, wherein the source terminal of the transistor is coupled to a junction of the third and fourth resistors, wherein the fourth resistor is also coupled to the positive supply rail, wherein the inverting input terminal of the op-amp is coupled to a junction of the second and third resistors, and wherein the second resistor is coupled to the first resistor and the first resistor is coupled to the input terminal of the V/I converter;

a protection circuit coupled to the V/I converter to prevent over-voltage and over-current conditions, wherein the protection circuit comprises:

a first diode coupled between the drain terminal of the transistor and an output terminal of the protection circuit;

a second diode coupled to a junction of the drain terminal of the transistor and the first diode, wherein the second diode is also coupled to an fifth resistor;

a first bipolar junction transistor (BJT) including a base terminal, an emitter terminal, and a collector terminal, wherein the emitter terminal of the first BJT is coupled to the fifth resistor and the base terminal of the first BJT is coupled to ground, wherein the collector terminal of the first BJT is coupled to a junction of the positive supply rail and a sixth resistor; and a second BJT including a base terminal, an emitter terminal, and a collector terminal, wherein the base terminal of the second BJT is coupled to the sixth resistor and the emitter terminal of the second BJT is coupled to the positive supply rail, wherein the collector terminal of the second BJT is coupled to the gate terminal of the transistor.

13. The measurement device of claim 12, wherein the transistor is a metal-oxide semiconductor field-effect transistor (MOSFET).

14. The measurement device of claim 12, further comprising a second voltage divider circuit coupled to the positive supply rail and the non-inverting input terminal of the op-amp, wherein the second voltage divider circuit includes a seventh resistor and an eighth resistor, wherein the non-inverting input terminal of the op-amp is coupled to a junction of the seventh and eighth resistors, and wherein the seventh resistor is also coupled to the positive supply rail and the eighth resistor is also coupled to ground.

15. The measurement device of claim 14, wherein a ratio corresponding to the second voltage divider circuit, which is equal to a resistance value of the seventh resistor divided by a resistance value of the eighth resistor, is equal to a ratio corresponding to the first voltage divider circuit, which is equal to a resistance value of the third resistor plus a resistance value of the fourth resistor divided by a resistance value of the first resistor plus a resistance value of the second resistor.

16. The measurement device of claim 15, wherein the ratio corresponding to the second voltage divider circuit is equal to the ratio corresponding to the first voltage divider circuit to improve power supply rejection.

17. The measurement device of claim 15, wherein if the first resistor is R1, the second resistor is R2, the third resistor is R3, the fourth resistor is R4, the seventh resistor is R7, the eighth resistor is R8, the control voltage is $V_1$, the positive supply rail is $V_S$, and the output current is $I_O$, a transfer function of the V/I converter is the following:

$$I_O(V_1, V_S) \approx \frac{R3}{R2+R1} * \frac{V1}{R4} + \frac{V1}{R2+R1} +$$

-continued $$V_S * \left[ \frac{1}{R4} \left[ 1 - \left( 1 + \frac{R3}{R2+R1} + \frac{R4}{R2+R1} \right) * \frac{R6}{R6+R5} \right] \right].$$

18. The measurement device of claim 17, wherein if the ratio corresponding to the second voltage divider circuit is equal to the ratio corresponding to the first voltage divider circuit, the output current ($I_O$) is independent of the positive supply rail ($V_S$) and the transfer function of the V/I converter simplifies to the following:

$$I_O(V_1) \approx \frac{R3}{R2+R1} * \frac{V1}{R4} + \frac{V1}{R2+R1}.$$

19. The measurement device of claim 18, wherein a ratio corresponding to the resistance value of the fourth resistor divided by the resistance value of the first resistor is equal to a ratio corresponding to the resistance value of the third resistor divided by the resistance value of the second resistor, which is also equal to the ratio corresponding to the resistance value of the seventh resistor divided by the resistance value of the eighth resistor.

20. The measurement device of claim 14, further comprising a ninth resistor coupled between the positive supply rail and the gate terminal of the transistor.

21. The measurement device of claim 12, wherein a common mode voltage of the op-amp is constant which reduces non-linearity errors.

22. The measurement device of claim 12, wherein the fourth resistor is a sense resistor, wherein the V/I converter is operable to reflect the control voltage across the sense resistor to generate a current to be provided to the transistor.

23. The measurement device of claim 12, wherein the first diode is a Schottky diode and the second diode is a pn-junction diode.

24. The measurement device of claim 12, comprised in a measurement system including a computer system and a unit under test (UUT), wherein the measurement device is operable to receive a digital signal from the computer system and to provide an analog signal to the UUT to stimulate the UUT.

25. A voltage-to-current (V/I) converter comprising:
a positive supply rail;
an input terminal operable to receive a control voltage;
an output terminal operable to provide an output current corresponding to the control voltage;
an op-amp including an inverting input terminal, a non-inverting input terminal, and an output terminal;
a metal-oxide semiconductor field-effect transistor (MOSFET) including a gate terminal, a source terminal, and a drain terminal, wherein the gate terminal is coupled to the output terminal of the op-amp;
a first voltage divider circuit including a first resistor, a second resistor, a third resistor, and a fourth resistor, wherein the source terminal of the MOSFET is coupled to a junction of the third and fourth resistors, wherein the fourth resistor is also coupled to the positive supply rail, wherein the inverting input terminal of the op-amp is coupled to a junction of the second and third resistors, and wherein the second resistor is coupled to the first resistor and the first resistor is coupled to the input terminal of the V/I converter;
a second voltage divider circuit including a fifth resistor and a sixth resistor, wherein the non-inverting input terminal of the op-amp is coupled to a junction of the fifth and sixth resistors, and wherein the fifth resistor is also coupled to the positive supply rail and the sixth resistor is also coupled to ground; and a protection circuit coupled to the MOSFET to prevent over-voltage and over-current conditions, the protection circuit including:
  a Schottky diode coupled between the drain terminal of the MOSFET and the output terminal of the V/I converter;
  a pn-junction diode coupled to a junction of the drain terminal of the MOSFET and the Schottky diode, wherein the pn-junction diode is also coupled to a seventh resistor;
  a first bipolar junction transistor (BJT) including a base terminal, an emitter terminal, and a collector terminal, wherein the emitter terminal of the first BJT is coupled to the seventh resistor and the base terminal of the first BJT is coupled to ground, wherein the collector terminal of the first BJT is coupled to a junction of the positive supply rail and an eighth resistor; and
  a second BJT including a base terminal, an emitter terminal, and a collector terminal, wherein the base terminal of the second BJT is coupled to the eighth resistor and the emitter terminal of the second BJT is coupled to the positive supply rail, wherein the collector terminal of the second BJT is coupled to the gate terminal of the transistor.

26. A measurement device comprising:
a voltage-to-current converter including:
  a positive supply rail;
  an input terminal operable to receive a control voltage;
  an output terminal operable to provide an output current corresponding to the control voltage;
  an op-amp including an inverting input terminal, a non-inverting input terminal, and an output terminal;
  a metal-oxide semiconductor field-effect transistor (MOSFET) including a gate terminal, a source terminal, and a drain terminal, wherein the gate terminal is coupled to the output terminal of the op-amp and the drain terminal is coupled to the output terminal of the V/I converter;
  a first voltage divider circuit including a first resistor, a second resistor, a third resistor, and a fourth resistor, wherein the source terminal of the MOSFET is coupled to a junction of the third and fourth resistors, wherein the fourth resistor is also coupled to the positive supply rail, wherein the inverting input terminal of the op-amp is coupled to a junction of the second and third resistors, and wherein the second resistor is coupled to the first resistor and the first resistor is coupled to the input terminal of the V/I converter; and
  a second voltage divider circuit including a fifth resistor and a sixth resistor, wherein the non-inverting input terminal of the op-amp is coupled to a junction of the fifth and sixth resistors, and wherein the fifth resistor is also coupled to the positive supply rail and the sixth resistor is also coupled to ground; and a protection circuit coupled to the V/I converter to prevent over-voltage and over-current conditions, the protection circuit including:
  a Schottky diode coupled between the drain terminal of the MOSFET and an output terminal of the protection circuit;
  a pn-junction diode coupled to a junction of the drain terminal of the MOSFET and the Schottky diode, wherein the pn-junction diode is also coupled to a seventh resistor;
  a first bipolar junction transistor (BJT) including a base terminal, an emitter terminal, and a collector terminal, wherein the emitter terminal of the first BJT is coupled to the seventh resistor and the base terminal of the first BJT is coupled to ground, wherein the collector terminal of the first BJT is coupled to a junction of the positive supply rail and an eighth resistor; and
  a second BJT including a base terminal, an emitter terminal, and a collector terminal, wherein the base terminal of the second BJT is coupled to the eighth resistor and the emitter terminal of the second BJT is coupled to the positive supply rail, wherein the collector terminal of the second BJT is coupled to the gate terminal of the transistor.

* * * * *